United States Patent
Kopf

(10) Patent No.: US 9,306,365 B2
(45) Date of Patent: Apr. 5, 2016

(54) PUMP DEVICE FOR PUMPING AN AMPLIFYING LASER MEDIUM

(71) Applicant: Daniel Kopf, Rothis (AT)

(72) Inventor: Daniel Kopf, Rothis (AT)

( * ) Notice: Subject to any disclaimer, the term of this patent is extended or adjusted under 35 U.S.C. 154(b) by 0 days.

(21) Appl. No.: 14/418,983

(22) PCT Filed: Jul. 26, 2013

(86) PCT No.: PCT/AT2013/000126
§ 371 (c)(1),
(2) Date: Feb. 2, 2015

(87) PCT Pub. No.: WO2014/019003
PCT Pub. Date: Feb. 6, 2014

(65) Prior Publication Data
US 2015/0244141 A1    Aug. 27, 2015

(30) Foreign Application Priority Data
Aug. 3, 2012    (AT) .................. A 858/2012

(51) Int. Cl.
*H01S 3/091*    (2006.01)
*H01S 3/0941*    (2006.01)
(Continued)

(52) U.S. Cl.
CPC .......... *H01S 3/0941* (2013.01); *G02B 19/0057* (2013.01); *G02B 27/0983* (2013.01); *H01S 3/0407* (2013.01); *H01S 3/0606* (2013.01); *H01S 3/0623* (2013.01); *H01S 3/094* (2013.01); *H01S 3/117* (2013.01); *H01S 3/16* (2013.01); *H01S 3/1643* (2013.01); *H01S 3/1671* (2013.01); *H01S 3/17* (2013.01);
(Continued)

(58) Field of Classification Search
CPC ......... H01S 3/0941; H01S 3/094; H01S 3/16; H01S 3/1643
USPC ...................................... 372/75, 41
See application file for complete search history.

(56) References Cited

U.S. PATENT DOCUMENTS 5,307,430 A    4/1994    Beach et al.
5,900,981 A *  5/1999    Oren et al. .................... 359/619
(Continued)

FOREIGN PATENT DOCUMENTS

CN    201001003 Y    1/2008
CN    101150240 A    3/2008
(Continued)

OTHER PUBLICATIONS

Ma et al., "Conductively Cooled All-Solid State Zigzag Slab Laser," Chinese Optics Letters, vol. 6, No. 5 (May 10, 2008).
(Continued)

*Primary Examiner* — Kinam Park
(74) *Attorney, Agent, or Firm* — Volpe and Koenig, P.C.

(57) ABSTRACT

A pump device for pumping an amplifying laser medium (1), having a radiation source (13) with a plurality of laser diodes (15, 16) that emit laser beams (17) which have parallel beam axes (a) extending in the direction of a z axis and which diverge at least twice as much in the direction of an x axis perpendicular to the z axis as in the direction of a y axis perpendicular to the z axis and to the x axis. The pump device also has at least one optical component (22, 22', 22") with at least one cylinder surface (23), with which at least some of the laser beams (17) emitted by the laser diodes (15, 16) interact. The cylinder surface (23) lies parallel to the x axis and is curved on a plane perpendicular to the x axis.

8 Claims, 7 Drawing Sheets

(51) Int. Cl.

| | |
|---|---|
| H01S 3/094 | (2006.01) |
| H01S 3/16 | (2006.01) |
| G02B 19/00 | (2006.01) |
| G02B 27/09 | (2006.01) |
| H01S 5/40 | (2006.01) |
| H01S 3/06 | (2006.01) |
| H01S 3/04 | (2006.01) |
| H01S 3/117 | (2006.01) |
| H01S 3/17 | (2006.01) |
| H01S 3/115 | (2006.01) |
| H01S 5/00 | (2006.01) |
| H01S 3/02 | (2006.01) |

(52) U.S. Cl.
CPC ............ *H01S 5/4012* (2013.01); *H01S 5/4025* (2013.01); *H01S 3/025* (2013.01); *H01S 3/094057* (2013.01); *H01S 3/115* (2013.01); *H01S 5/0071* (2013.01); *H01S 5/405* (2013.01)

(56) References Cited

U.S. PATENT DOCUMENTS

| 7,639,722 | B1* | 12/2009 | Paxton et al. | 372/71 |
|---|---|---|---|---|
| 2002/0025096 | A1* | 2/2002 | Wang et al. | 385/8 |
| 2005/0063435 | A1* | 3/2005 | Imai et al. | 372/43 |
| 2006/0018356 | A1 | 1/2006 | Voss et al. | |
| 2006/0126690 | A1 | 6/2006 | Kido et al. | |
| 2007/0064754 | A1 | 3/2007 | Zheng et al. | |
| 2009/0129420 | A1* | 5/2009 | Regaard et al. | 372/50.12 |
| 2010/0040098 | A1* | 2/2010 | Parent et al. | 372/29.021 |
| 2011/0064112 | A1* | 3/2011 | Oumiskov et al. | 372/71 |
| 2011/0216792 | A1* | 9/2011 | Chann et al. | 372/31 |
| 2012/0033704 | A1* | 2/2012 | Kopf et al. | 372/72 |

FOREIGN PATENT DOCUMENTS

| CN | 201113206 Y | 9/2008 |
|---|---|---|
| CN | 100428587 C | 10/2008 |
| CN | 102208742 B | 11/2012 |
| DE | 10235713 A1 | 2/2004 |
| EP | 0717476 | 6/1996 |
| EP | 1391753 | 2/2004 |
| EP | 2061122 | 5/2009 |
| JP | 2004096092 | 3/2004 |
| WO | 2007078456 A1 | 7/2007 |
| WO | 2010017619 | 2/2010 |
| WO | 2010052308 | 5/2010 |

OTHER PUBLICATIONS

"Side Pumping," Encyclopedia of Laser Physics and Technology, pp. 1-2 available at http://www.rp-photonics.com/side_pumping.html (downloaded Jul. 10, 2012).

"Diode Stacks," "Side Pumping," Encyclopedia of Laser Physics and Technology, pp. 1-2 available at http://www.rp-photonics.com/diode_stacks.html (downloaded Jul. 10, 2012).

Armandillo, Errico, et al., "Diode-Pumped High-Efficiency High-Brightness Q-Switched ND:YAG Slab Laser", Optics Letters, vol. 22, No. 15, Aug. 1, 1997, pp. 1168-1170.

Honea, Eric C., "Analysis of an Intracavity-Doubled Diode-Pumped Q-Switched Nd:YAG Laser Producing More Than 100 W of Power at 0.532 0.532 μm", Optics Letters, vol. 23, No. 15, Aug. 1, 1998, pp. 1203 to 1205.

* cited by examiner

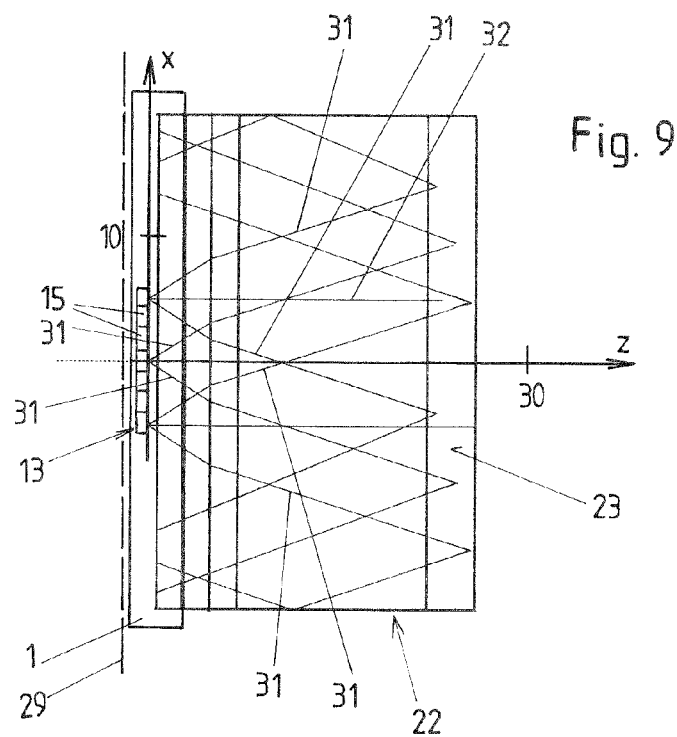
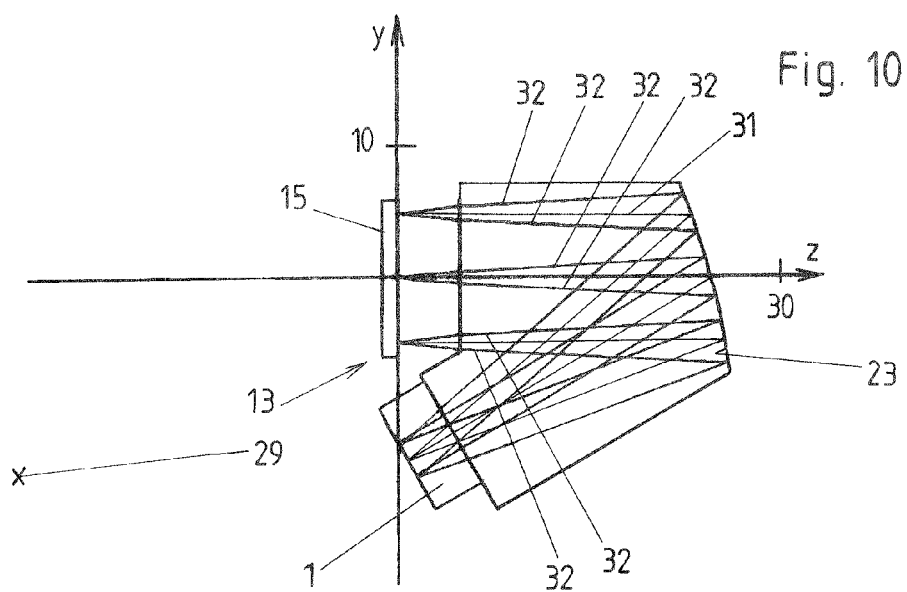

PUMP DEVICE FOR PUMPING AN AMPLIFYING LASER MEDIUM

BACKGROUND

The invention relates to a pump device for pumping an amplifying laser medium, comprising a radiation source and a multiplicity of laser diodes which emit laser beams that have parallel beam axes extending in the direction of a z axis and diverging at least two times as strongly in the direction of an x axis perpendicular to the z axis than in the direction of a y axis perpendicular to the z axis and perpendicular to the x axis, and at least one optical component having at least one cylindrical surface, with which at least some of the laser beams emitted by the laser diodes interact.

In order to pump solid-state lasers, laser diodes have recently been used increasingly instead of conventional flash lamps. A solid-state laser pumped in this way is described, for example, in Errico Armandillo and Callum Norrie: "Diode-pumped High-efficiency High-brightness Q-switched ND:YAG Slab Laser", OPTICS LETTERS, Vol. 22, No. 15, 1 Aug. 1997, pages 1168 to 1170. Laser diodes have, in particular, advantages in terms of efficiency, pump efficiency and lifetime. In order to achieve higher pump powers, a plurality of laser diodes are combined in a common component. In the case of bars, a plurality of laser diodes (=individual emitters) are arranged on a strip-shaped chip and are operated electrically in parallel, and mounted on a common heat sink. The individual emitters of such a bar respectively emit a laser beam which has a significantly larger emission angle in the direction of a so-called fast axis, which in this document is referred to as the x axis, than in a direction perpendicular thereto of a so-called slow axis, which is referred to in this document as the y axis. For example, the divergence in the y direction is +/−5° and the divergence in the x direction is +/−33°. The beam axes of the laser beams of the laser diodes are parallel to one another and parallel to a z axis perpendicular to the x and y axes.

In laser diode stacks, a plurality of such bars are arranged with their wide sides and/or narrow sides next to one another. A commercially available laser diode stack is formed, for example, of 8 bars arranged next to one another in the x direction, with respectively 40 individual emitters spaced apart in the y direction, the emitted peak optical power being 2400 W at a wavelength of 808 nm from an emitting area of 10 mm×11.9 mm. Other numbers of bars and/or individual emitters are likewise known.

The laser radiation emitted by such a laser diode stack therefore diverges strongly, so that the imaging with optical components with which the laser radiation interacts therefore encounters limits in terms of aperture and imaging quality. In order to counteract this, it is known to arrange a microlens in the form of a cylindrical lens in front of the laser diodes of a respective bar. The cylinder axes of the microlenses are aligned in the y direction, so that the strong divergence in the x direction is reduced, for example to less than 1°. In this way, the subsequent optics for imaging the laser radiation into the amplifying laser medium are substantially simplified. However, the use of such "fast-axis collimation" microlenses leads to increased material and assembly costs (due to narrow tolerance requirements) and to power losses which, for instance, lie in the range of 10%.

Furthermore known are e.g. rod-shaped or frustopyramidal optical components extending in the z direction, the laser radiation of which is guided by means of total internal reflection to the amplifying laser medium, see for example Eric C. Honea et al.: "Analysis of an Intracavity-doubled Diode-pumped Q-switched Nd:YAG Laser Producing More Than 100 W of Power At 0.532 μm", OPTICS LETTERS, Vol. 23, No. 15, 1 Aug. 1998, pages 1203 to 1205 and WO 2010/052308 A1. A disadvantage in this case is, in particular, the required overall length in the z direction, as a result of which the compactness of the overall laser is reduced.

SUMMARY

It is an object of the invention to provide an advantageous pump device of the type mentioned in the introduction, which, with high efficiency, allows compact formation. According to the invention, this is achieved by a pump device having one or more features of the invention.

In the pump device according to the invention, the cylindrical surface extends parallel to the x axis and is curved in the y-z plane, i.e. in a plane perpendicular to the x axis. The cylindrical surface therefore has an imaging, in particular converging, effect in the y-z plane (i.e. with respect to the slow axis) but not in the x-z plane (i.e. with respect to the fast axis).

If the laser radiation emitted by a respective laser diode is considered as a laser beam with a radiation cone, within which 95% of the total power of the laser radiation emitted by the laser diode lies, then the lines of intersection of the lateral surface of the radiation cone with a plane parallel to the y-z plane and extending through the beam axis are subsequently referred to as the marginal rays of the laser beam in relation to the y-z plane. The emission angle of these marginal rays corresponds to half the total aperture angle of the radiation cone in the plane parallel to the y-z plane and extending through the beam axis. The same applies for the marginal rays of the laser beam in relation to the x-z plane. The emission angle is thus the angle which a respective marginal ray makes with the beam axis, and therefore defines the divergence of the laser beam emerging from the laser diode in relation to the y-z plane or in relation to the x-z plane.

The converging effect of the cylindrical surface in the y-z plane means that by the interaction with the cylindrical surface at least the divergence of the marginal rays in relation to the y-z plane is reduced, or after the interaction with the cylindrical surface these marginal rays travel parallel to one another (i.e. the aperture angle of the radiation cone is zero, and the laser beam is thus collimated), or even converge with one another (i.e. the aperture angle of the radiation cone is negative).

Preferably, for a respective laser beam, the two marginal rays in relation to the y-z plane make an angle of less than 10° with one another after the interaction with the cylindrical surface, i.e. the laser beams are at least substantially collimated.

In one advantageous embodiment of the invention, the pump device has no reflective or refractive surface that is curved only or also in a plane perpendicular to the y axis, i.e. in the x-z plane, and with which the laser beams that interact with the cylindrical surface curved in the y-z plane interact.

The laser beams emitted by at least a plurality of laser diodes, preferably at least the majority of the laser diodes, particularly preferably all the laser diodes, of the radiation source interact with this cylindrical surface lying parallel to the x axis and curved in the y-z plane, i.e. with the same cylindrical surface. That is to say, for the laser beams emitted by a plurality of laser diodes, preferably the majority of the laser diodes, particularly preferably all the laser diodes, there is a common optical component having at least one such cylindrical surface, with which these laser beams interact.

In one possible embodiment of the invention, the cylindrical surface is formed reflectively, so that the laser beams are reflected on the cylindrical surface (apart from losses). The cylindrical surface is concave in the direction of the side from which the laser beams are incident. In this case, in one possible alternative embodiment, the reflection may take place on the outer side of the component, without the laser beams entering the component. The component is therefore formed as cylindrical mirror. In another possible alternative embodiment, the laser beams may enter the component through an entry surface and be reflected on the cylindrical surface inside the component. The cylindrical surface may in this case be formed by a mirrored cylindrical surface (=outer surface) of the component. It would also be conceivable and possible in principle to provide a component having a mirrored inner cylindrical surface. The laser beams reflected by the cylindrical surface emerge from the component through an exit surface of the component. Preferably, the entry surface and the exit surface are formed by different surfaces of the optical component, i.e. the entry and exit surfaces are spatially separated from one another.

In another possible embodiment, the cylindrical surface is refractive, so that the laser beams pass through the cylindrical surface (apart from losses, in particular by reflection). The component is therefore a cylindrical lens. The cylindrical surface may be an entry surface, through which the laser beams pass into the component. Through an exit surface different to (=spatially separated from) the entry surface, the laser beams emerge from the component again. The exit surface may in this case be formed so as to be planar (=flat). The inverse configuration is also possible, in which the refractive cylinder surface is the exit surface of the optical component, from which the laser beams emerge from the component, the entry surface being planer (=flat). Both the entry surface and the exit surface may also be cylindrical surfaces, which lie parallel to the x axis and are curved in the y-z plane. If only the entry surface or the exit surface is formed by such a cylindrical surface, the other of these two surfaces may also have a configuration curved in a different way instead of a planar configuration, optionally only or also in the x-z plane (in order also to induce a converging effect with respect to the x axis). The at least one cylindrical surface lying parallel to the x axis and curved in the y-z plane is convex to achieve a converging effect in the direction of the outer side of the component, and is thus in particular formed by a convex surface (=outer surface) of the component.

The cylindrical surface of the optical component is formed by a part of the overall circumference of a lateral cylinder surface, in particular of a right cylinder, i.e. it constitutes a part of a cylinder lateral surface extending over a particular polar angle range <2π. This may, for example, be the lateral surface of a circular cylinder, parabolic cylinder or elliptical cylinder. Such cylindrical surfaces have a cylinder axis which is therefore parallel to the x axis.

The cylinder surface favorably has a focal line on which rays that are incident parallel to an optical axis of the component on one side intersect, or at least approximately intersect.

In one advantageous embodiment of the invention, there is no other optical component, with which the laser beams interact, in the beam profile of the laser beams emitted by the laser diodes between the laser diodes and the optical component having the at least one cylindrical surface lying parallel to the x axis and curved in the x-z plane, i.e. the laser beams emitted by the laser diodes enter the optical component directly from the laser diodes after passing through an air gap.

The radiation source preferably comprises two or more laser diodes arranged at different positions in relation to the x axis, the laser beams of which interact with the cylindrical surface of the optical component, and particularly preferably also two or more laser diodes arranged at different positions in relation to the y axis, the laser beams of which interact with the cylindrical surface of the optical component. In one advantageous embodiment of the invention, the laser beams of all laser diodes of the radiation source interact with the cylindrical surface of the optical component.

Preferably, all laser diodes of the radiation source lie in a common plane perpendicular to the z axis (i.e. in an x-y plane).

According to one preferred embodiment of the invention, the radiation source is a laser diode stack which comprises a plurality of bars, each with a plurality of laser diodes, the laser diodes of a respective bar being spaced apart in the y direction, i.e. lying on a common straight line parallel to the y axis. In this case, at least two bars, in one possible embodiment of the invention all bars, are preferably arranged next to one another in the direction of the x axis, and it is thus a vertical laser diode stack, the laser diodes of which are arranged in a plurality of rows (preferably three or more) extending in the y direction and a plurality of columns (preferably ten or more) extending in the x direction.

In order to guide the laser beams emitted by the laser diodes in the x direction, i.e. in the direction of the fast axis, so that the laser radiation emitted in this direction by the radiation source is not distributed over an excessively large spatial region, it is advantageous for reflective bounding surfaces to be provided, which limit the total extent of the laser radiation emitted by the radiation source in the direction of the x axis on both sides. By these preferably planar (=flat) bounding surfaces, those beam parts of the laser beams emitted by the laser diodes which strike them are reflected. The bounding surfaces preferably lie perpendicular to the x axis. According to one advantageous embodiment in this case, the optical component, which has the at least one cylindrical surface lying parallel to the x axis and curved in the y-z plane, also comprises the reflective bounding surfaces. These are thus formed by side surfaces of the optical component, which are preferably perpendicular to the entry and exit surfaces of the optical component. Favorably, the reflection on the reflective bounding surfaces takes place by total internal reflection.

It is also conceivable and possible to use separate mirrors, which comprise the reflective bounding surfaces.

A laser, in particular a solid-state laser, the amplifying laser medium of which is pumped by a pump device according to the invention, is in particular pulsed. Configuration as a continuous-wave laser is, however, likewise possible.

The amplifying laser medium of the laser is preferably side pumped by the pump device. For example, it is a slab laser, for example a zigzag slab laser (=laser with a zigzag slab gain medium). The entry and exit surfaces of the laser medium for the laser radiation emitted by the amplifying laser medium, which is guided in the resonator of the laser, may in this case advantageously be arranged at the Brewster angle.

BRIEF DESCRIPTION OF THE DRAWINGS

Other advantages and details of the invention will be explained below with the aid of the appended drawings, in which:

FIG. 9 shows a representation of the marginal rays, in relation to the x-z plane and the y-z plane, of the radiation cones of three of the laser diodes in a projection into the x-z plane;

FIG. 10 shows a representation of the marginal rays, in relation to the x-z plane and the y-z plane, of the radiation cones of three of the laser diodes in a projection into the y-z plane;

The drawings have different scales. The units indicated in FIGS. 7 to 16 are mm.

DETAILED DESCRIPTION OF THE PREFERRED EMBODIMENTS

Figure 1:
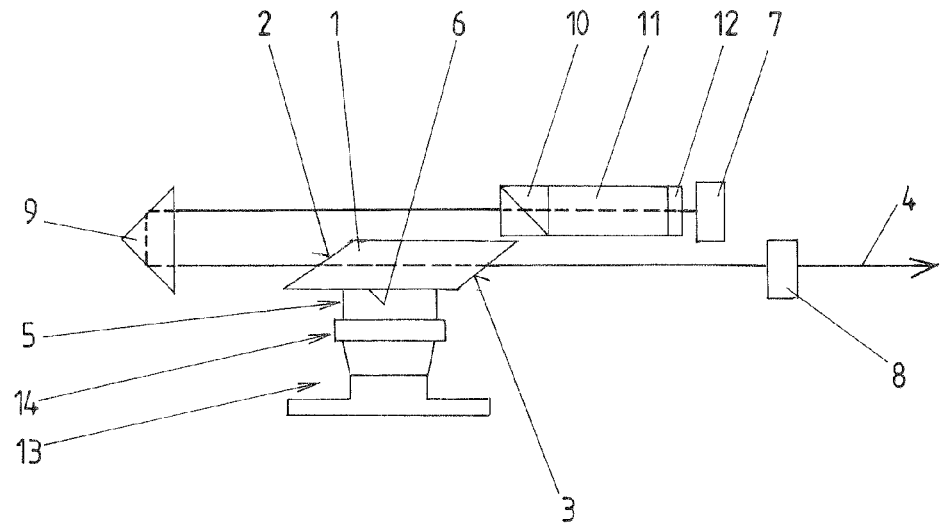
FIG. 1 shows a highly schematized representation of an exemplary embodiment of a laser pumped according to the invention.

One possible embodiment of a laser, which is pumped according to the invention, is represented schematically in FIG. 1. It is a solid-state laser, the amplifying (active) laser medium of which is formed of a crystalline or vitreous (amorphous) solid body. For example, the amplifying laser medium 1 may be Nd:YAG, Nd:glass, Nd:vanadate or Yb:YAG.

The amplifying laser medium is arranged in a resonator, the component parts of which will be explained in more detail further below.

The amplifying laser medium 1 is for example formed in the shape of a slab, i.e. the laser is a slab laser. Although the beam of the laser radiation emitted by the amplifying laser medium 1 is represented schematically in FIG. 1 as traveling in a straight line through the amplifying laser medium 1, it could also travel in a zigzag shape therethrough. The two surfaces, entry and exit, 2, 3 for the laser radiation emitted by the laser medium 1 and traveling through the resonator are advantageously arranged at the Brewster angle, although this is not absolutely necessary.

The amplifying laser medium 1 is side pumped, as is known. The laser radiation 5 pumping the amplifying laser medium 1 thus enters the laser medium not through the entry and exit surfaces 2, 3, but through a side surface 6. The latter is angled with respect to the entry and exit surfaces 2, 3.

Instead of in the shape of a slab, the laser medium 1 could for example also be formed in the shape of a rod.

The resonator comprises an end mirror 7 and an output mirror 8, in order to output the laser beam 4 emitted by the laser. The resonator represented is folded once, to which end a return prism 9 is arranged in the beam path. The folding could also be omitted, or the resonator could be folded several times. Other folding mirrors could be provided.

In order to form a Q-switch, in the exemplary embodiment represented a polarizer 10, a Pockels cell 11 and a lambda/4 plate 12 are arranged in the beam path of the resonator. Thus, the laser radiation emitted by the laser is pulsed. In order to form pulses, Q-switches other than electro-optical Q-switches could also be provided, in particular acousto-optical Q-switches.

One of the mirrors arranged in the beam path, in particular the output mirror 8 or the end mirror 7, could, as is known, be formed as a gradient mirror, the reflectivity of which varies over the mirror surface, in this case being greater in a central region than in an edge region. In this way, the beam profile of the laser beam can be influenced, for example in order to achieve a more rapid edge fall-off of the intensity, and/or the beam quality of the laser beam can be improved.

The pumping of the amplifying laser medium is carried out by means of a radiation source 13, which comprises a multiplicity of laser diodes. The optics 14 of the pump device, by which the laser radiation output by the radiation source is advantageously to be delivered to the amplifying laser medium 1, is indicated only schematically in FIG. 1.

The radiation source 13 is preferably configured in the form of a laser diode stack, an example of this being represented in FIGS. 2 to 5. The laser diode stack comprises a plurality of bars 15, each of which has a plurality of laser diodes 16 that are spaced apart from one another in the direction of a y axis. For example, there may be from twenty to sixty laser diodes (=individual emitters) 16 per bar 15. In the direction of an x axis perpendicular to the y axis, a plurality of such bars 15 are arranged next to one another, their laser diodes 16 respectively being spaced apart from one another in the y direction (respectively on a straight line arranged parallel to the y axis). For example, there may be from five to fifteen bars 15. Two or more bars 15 could also be arranged next to one another in the y direction, so that there would be two or more rows, extending in the x direction, of bars 15 arranged next to one another.

For one of the laser diodes 16 of the radiation source 13, the radiation cone of the laser beam 17 emitted by it is represented. The beam axis a is parallel to the z axis, which is perpendicular to the x and y axes. The beam axes a of all laser diodes 16 of the laser source 13 are parallel to one another, the laser diodes 16 respectively having the same radiation characteristic.

A respective radiation cone of a laser diode is defined in this document in that it delimits the region within which 95% of the laser radiation power emitted overall by the laser diode is emitted.

Marginal rays 31, in relation to the x-z plane, of a respective one of the laser diodes, in this document refer to the lines which delimit the radiation cone in an intersection of the radiation cone with a plane lying parallel to the x-z plane and extending through the beam axis a. Marginal rays 31, in relation to the y-z plane, of a respective one of the laser diodes, in this document refer to the lines which delimit the radiation cone in an intersection of the radiation cone with a plane lying parallel to the y-z plane and extending through the beam axis a.

In other words, it could also be said that the region, in a plane parallel to the x axis and to the z axis and extending through the beam axis a, within which 95% of the total power of the laser radiation emitted by the laser diode is emitted, is bounded by the marginal rays 31 for a respective laser diode. Similarly, the marginal rays 32 delimit such a region in a plane parallel to the y axis and to the z axis and passing through the beam axis a.

The emission angle 18 in relation to the x-z plane is the angle between the respective marginal ray 31 and the beam axis a. The emission angle 19 in relation to the y-z plane is the angle between the respective marginal ray 32 and the beam axis a.

When it is mentioned in this document that the beams are represented in the x-z plane or in the y-z plane, the projection into the x-z plane or y-z plane is respectively intended.

The laser beams 17 emitted by the laser diodes 16 have a divergence in the direction of the x axis at least two times as great, preferably at least three times as great, as in the direction of the y axis. The emission angle 18 in relation to the x-z plane is thus at least two times as great, preferably at least three times as great, as the emission angle 19 in relation to the y-z plane. For example, the emission angle 18 may be +/−33° and the emission angle 19 may be +/−5°.

Figure 6:
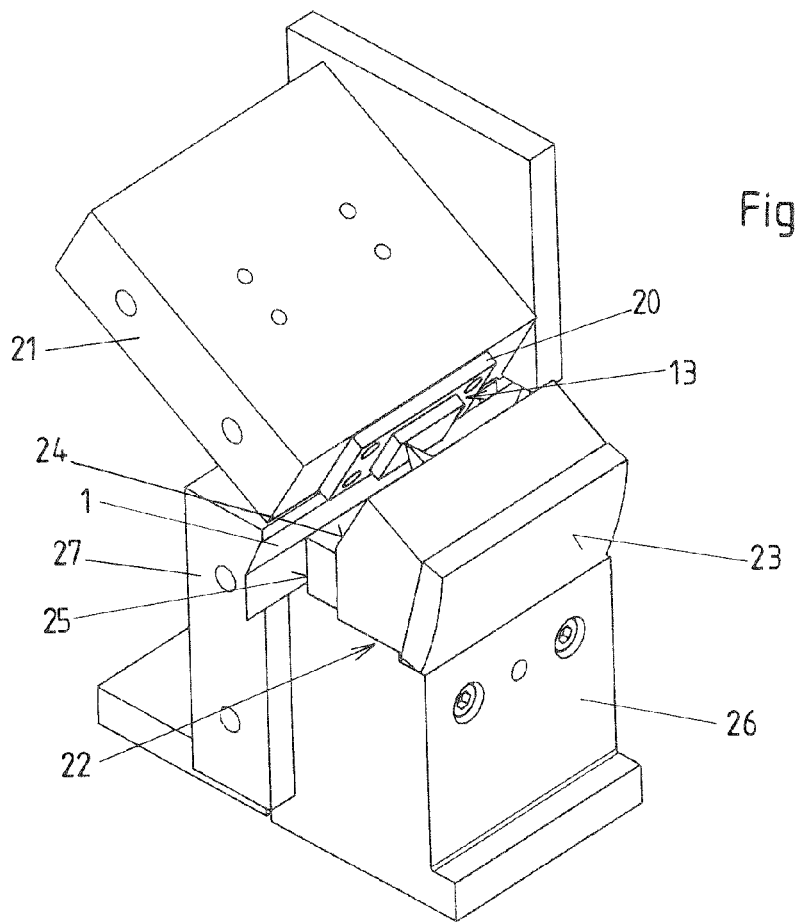
FIG. 6 shows a perspective view of a first embodiment of a pump device according to the invention in oblique view, together with the amplifying laser medium to be pumped.
Figure 2:
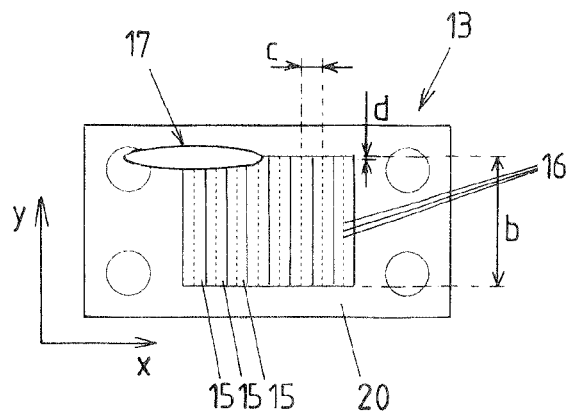
FIG. 2 shows an exemplary embodiment of a radiation source for a pump device according to the invention, in a view from the front.
Figure 3:
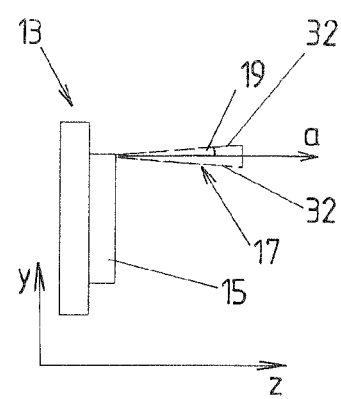
FIG. 3 shows the radiation source of FIG. 2 in side view.
Figure 4:
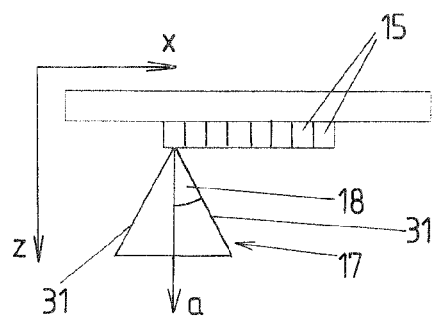
FIG. 4 shows the radiation source of FIG. 2 in a view from above.
Figure 5:
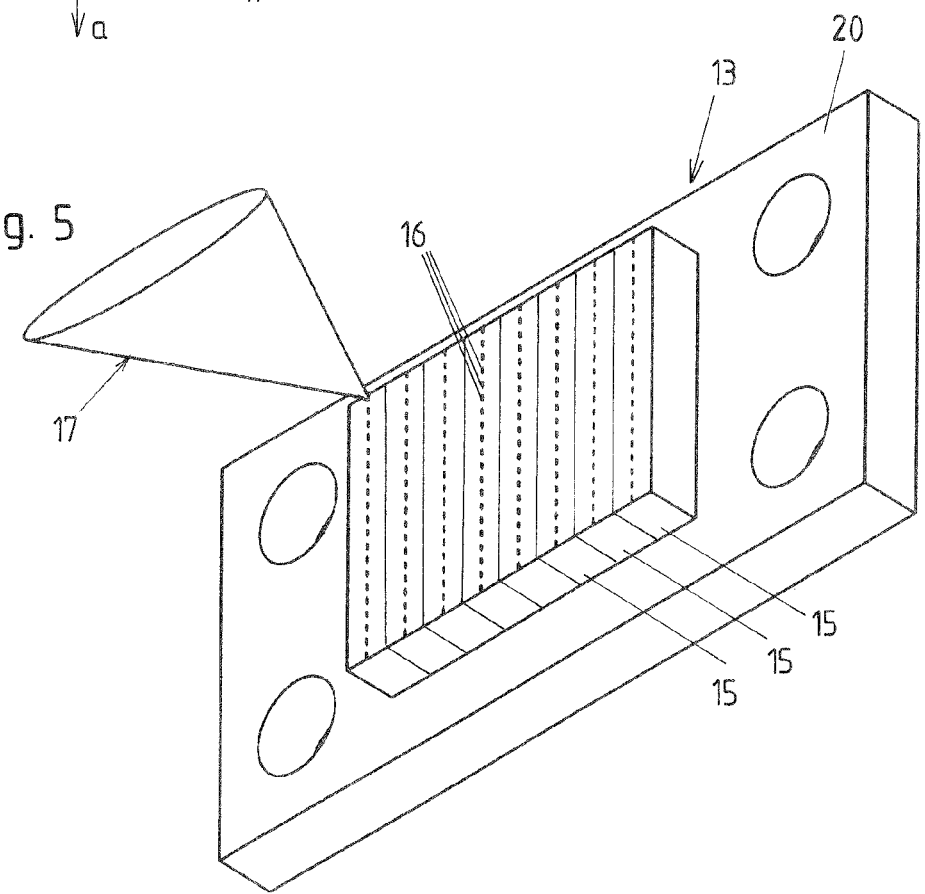
FIG. 5 shows an oblique view of the radiation source of FIG. 2.

The bars 15 are held on a carrier 20. FIG. 6 represents a heat sink 21, which may for example be water-cooled (the connections are not represented), for cooling the laser diode stack. For the sake of clarity, the electronics for operating the laser diode stack are not represented in FIG. 6.

The pump device furthermore comprises an optical component 22, which has a cylindrical surface 23. In this exemplary embodiment, the latter is formed by an outer surface, provided with a reflective coating, of the optical component 22. The laser beams 17 emitted by the laser diodes 16 of the radiation source 13 enter the optical component 22 (at least for the most part) through an entry surface 24 thereof. After the laser beams 17 have been reflected on the cylindrical surface 23, the laser beams 17 emerge (at least for the most part) from the exit surface 25 of the component 22. The entry surface 24 and the exit surface 25 are favorably provided with antireflection coatings.

The laser beams emerging through the exit surface 25 reach (for the most part) the laser medium 1. The entry surface 24 and the exit surface 25 are formed by different surfaces of the component 22, i.e. they do not overlap.

In the exemplary embodiment shown, the amplifying laser medium 1 bears directly on the exit surface 25 of the optical component 22 with the side surface 6, through which it is pumped. It would also be possible, for example in order to ensure total internal reflection in the case of a zigzag laser, to provide a small gap lying between them, or a transparent material lying between them, which has a lower refractive index than the material of the amplifying laser medium 1. At least, the distance of the laser medium 1 from the exit surface 25, measured in the direction of the surface normal to the side surface 6, is favorably less than the extent of the laser medium 1 measured in this direction.

In the exemplary embodiment, the optical component 22 comprising the cylindrical surface 23 is the only optical component, with which the laser radiation output by the radiation source 13 interacts, of the pump device. Preferably, there is at least only one optical component which has an imaging, in particular converging, effect.

In order to make it possible for the laser beams 17 to pass through the component 22, the latter is formed of a transparent material. Preferably, the transmission of the material of the optical component 22 at the wavelength of the laser beams 17 (=the wavelength of maximum intensity) is more than 99%, preferably more than 99.5%, over a distance of 10 mm (purely material transmission, surface reflections not taken into account). In practical embodiments, the value may be more than 99.8%. The total absorption of the laser radiation of the radiation source 13, passing through the optical component 22, may favorably be less than 3%, particularly preferably less than 1%. The distance traveled by the laser radiation 5 may in this case be less than 20 cm, preferably less than 10 cm. For example, the optical component may be formed of glass, for example SF6 or SF11. Other transparent materials may likewise be used, for example YAG.

In the exemplary embodiment, the refractive index n of the material of the optical component 22 is more than 1.6 at the wavelength of the laser radiation output by the radiation source 13. The refractive index of the high-index glass material SF6 is n=1.78 at a wavelength of 808 nm.

In other exemplary embodiments, a material with a refractive index of less than 1.6 may also be used, for example a silicate glass.

In FIG. 6, it is represented that the optical component 22 is formed of a plurality of parts made of transparent material and connected together, in particular by adhesive bonding. A one-piece configuration is also envisaged and possible. The optical component 22 is fastened on a carrier 26.

FIG. 6 furthermore represents a heat sink 27 which is for example water-cooled (the connections are not represented) and is used to cool the amplifying laser medium 1.

Figure 7:
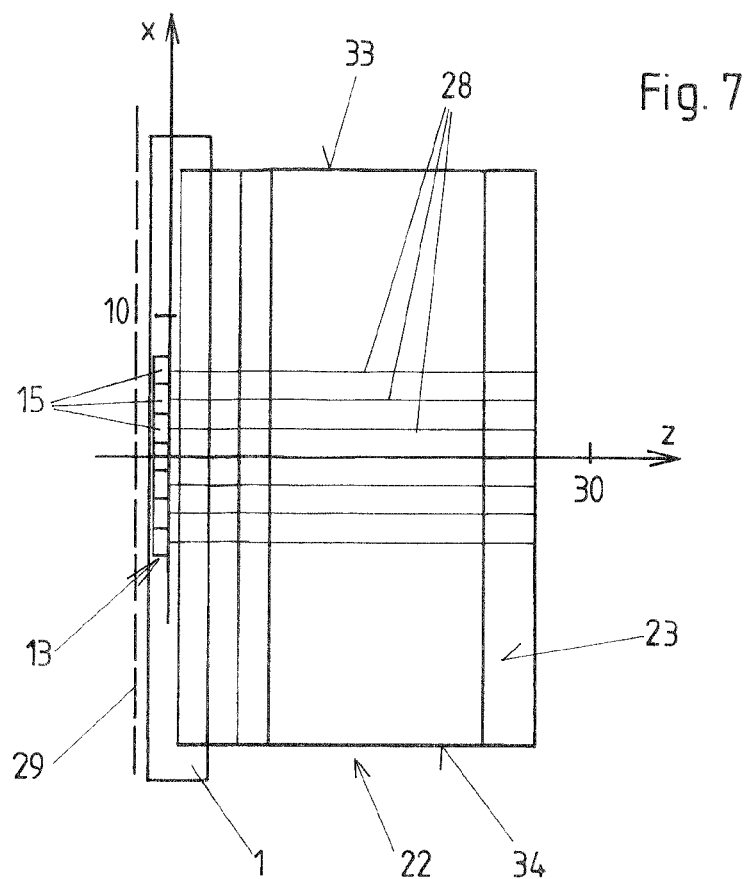
FIG. 7 shows a representation of the axial rays of the ray bundle of the individual laser diodes in the x-z plane.
Figure 8:
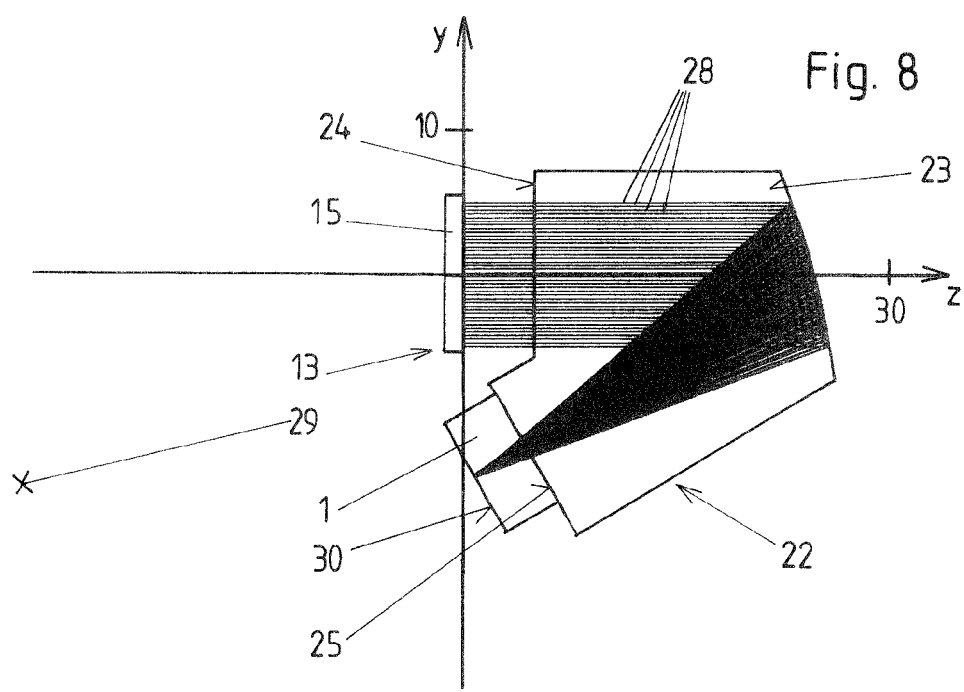
FIG. 8 shows a representation of the axial rays in the y-z plane.
Figure 11:
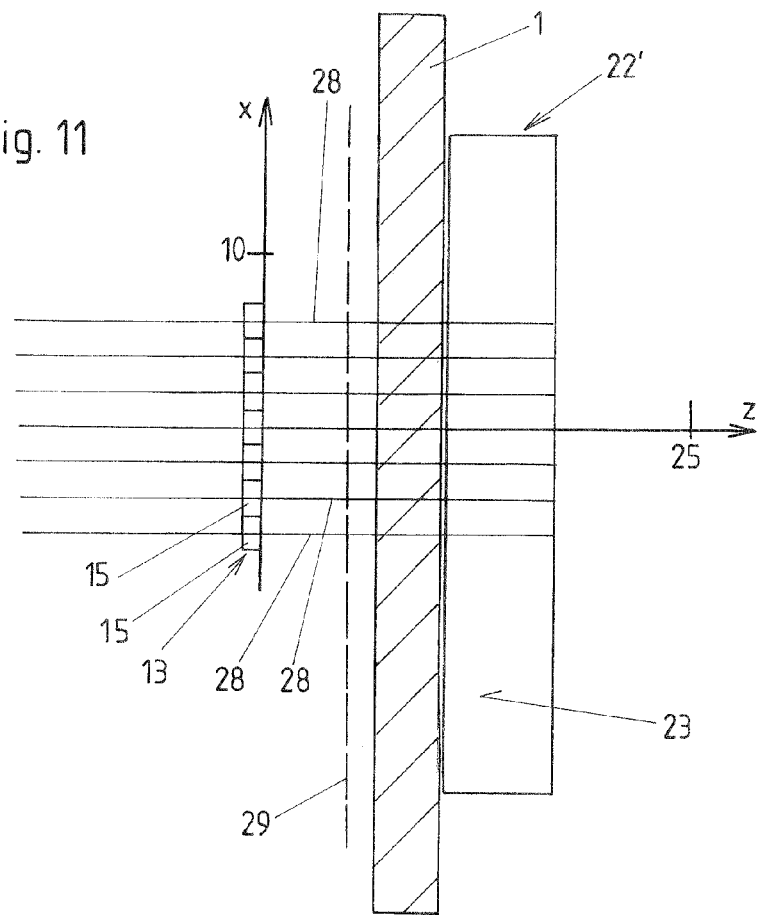
FIGS. 11 to 14 show representations similar to FIGS. 7 to 10 for a second embodiment of the invention.
Figure 12:
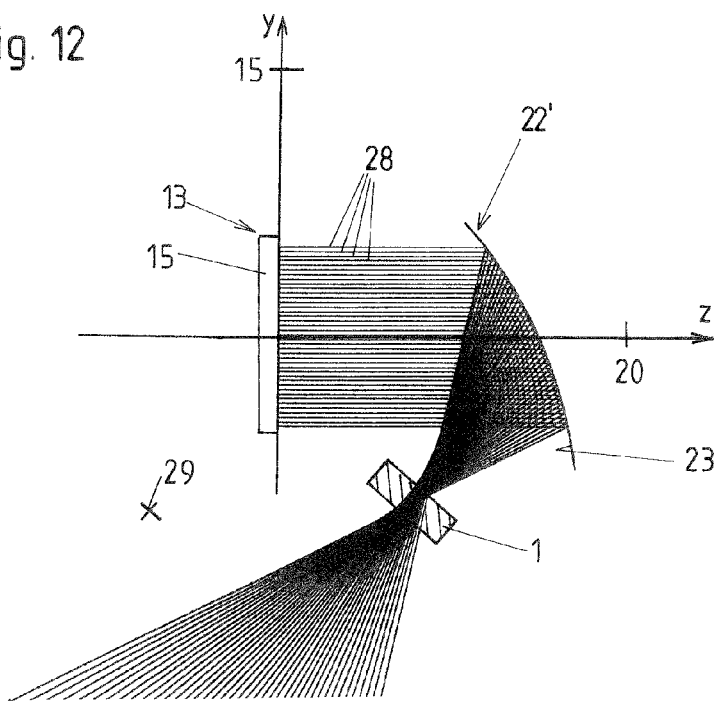
Figure 13:
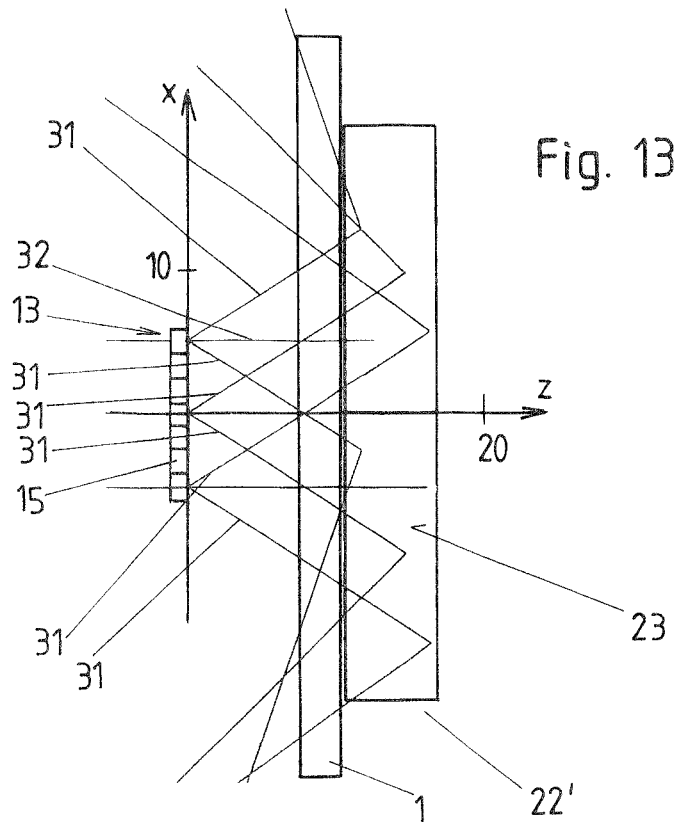
Figure 14:
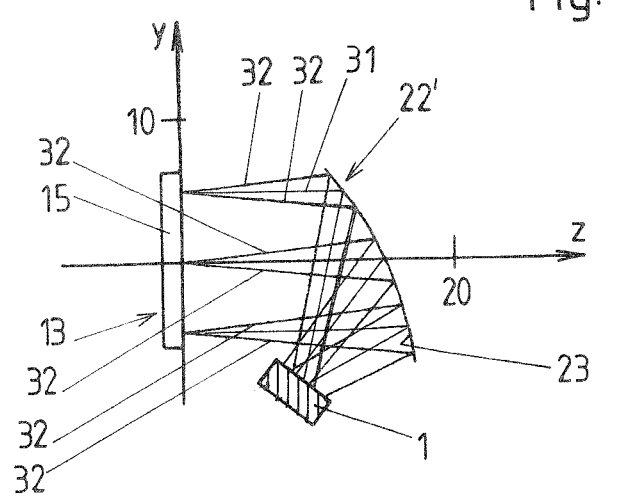

If the laser beams 17 emitted by the laser diodes 16 are respectively considered as a ray bundle, then FIGS. 7 and 8 represent the axial rays 28 of the ray bundle, i.e. the rays emitted along the beam axes a of the laser diodes 16, specifically in the x-z plane in FIG. 7 (a projection into the x-z plane would be the same here) and in the y-z plane in FIG. 8 (a projection into the y-z plane would be the same here). FIGS. 7 and 8 thus also represent the profile of the optical axes of the laser beams 17 emitted by the laser diodes 16 in the x-z plane, or in a projection into the x-z plane, and in the y-z plane, or in a projection into the y-z plane. The radiation source 13 formed as a laser diode stack, the optical component 22 and the amplifying laser medium 1 are indicated schematically.

The origins of the x and y axes are placed at the center of the radiation source 13. The origin of the z axis lies on the surface of the radiation source 13, by which the laser radiation is output.

In relation to the x direction, there is no effect on the axial rays 28 due to the optical component 22. The axial rays 28 travel in the x-z plane, or in a projection onto the x-z plane, parallel to the z axis from the radiation source 13 to the amplifying laser medium 1.

In relation to the y-z plane, the axial rays 28, which travel parallel to one another in the z direction as far as the cylindrical surface 23, are reflected by the cylindrical surface 23 in such a way that they converge on a point. Considered in spatial terms, the axial rays 28 converge (at least approximately) on a line of intersection which is parallel to the x axis and perpendicular to the y-z plane, and represents the focal line of the cylindrical surface 23.

The laser medium 1 is in this case arranged in such a way that the (approximate) line of intersection of the axial rays 28 lies in the region of the side surface 30 facing away from the optical component 22. This side surface 30 is favorably mirrored in this case, so it reflects back the laser beams 17 striking it. The line of intersection could also lie in a central region of the amplifying laser medium 1, or alternatively in the region of the side surface 6. Since bearing of the side surface 6 on the exit surface 25 of the optical component 22 is preferred, in these cases the geometry of the optical component could be adapted correspondingly.

FIGS. 7 and 8 also indicate the cylinder axis 29, around which the cylindrical surface 23 is curved. For example, the cylindrical surface 23 is formed by a circumferential part of a lateral surface of a right circular cylinder, which is curved around the cylinder axis 29. It could, for example, also be a parabolic or elliptical cylinder curved around the cylinder axis 29.

FIGS. 9 and 10 show representations similar to FIGS. 7 and 8, although in this case the projection of the marginal rays 31, 32 into the x-z plane and into the y-z plane is represented for the laser beams 17 emitted by three of the laser diodes 16. These are two laser diodes 16 on the edge (i.e. one of which has the largest values of the x and y coordinates and the other of which has the smallest values of the x and y coordinates out of all the laser diodes) as well as a laser diode 16 lying in a central region in relation to the x and y extent of the radiation source 13. FIG. 9 shows the projection into the x-z plane and FIG. 10 shows the projection into the y-z plane.

Since the refractive index n of the material of the component 22 is greater than that of air, the angles of the marginal rays 31, 32 with respect to the z axis are reduced according to the refractive index ratio when the respective laser beam 17 enters the optical component 22.

The marginal rays striking the cylindrical surface 23 are reflected thereby. In relation to the x-z plane, no change in the divergence of the two marginal rays 31 of the laser beam 17 of a respective laser diode 16 takes place in this case. In relation to the y-z plane, the two marginal rays 32 of the laser beam 17 of a respective laser diode 16 travel parallel after reflection by the cylindrical surface 23 in the exemplary embodiment. A configuration could also be provided such that the two marginal rays 32 of a respective laser beam 27 converge after reflection on the cylindrical surface 23. At least, the divergence of the two marginal rays 32 of a respective laser beam 17 in the y-z plane is reduced as a result of the reflection on the cylindrical surface 23.

The cylindrical surface 23 thus exerts a converging effect in relation to the y-z plane for the laser beams 17 emitted by the laser diodes 16, but not in relation to the x-z plane, or in other words a converging effect in relation to the original divergence in the y direction (=in the direction of the slow axis) but not in relation to the original divergence in the x direction (=in the direction of the fast axis).

In this exemplary embodiment, after reflection on the cylindrical surface 23, beam parts of the laser beams 17 of the laser diodes 16 at the edges strike bounding surfaces 33, 34 of the optical component 22, which delimit the optical component 22 in the x direction and are preferably perpendicular to the x axis. On these bounding surfaces 33, 34, total internal reflection of the beam parts striking them takes place. The reflection is represented for the corresponding marginal rays 31 in FIG. 10. Reflection of the beam parts on the bounding surfaces 33, 34 also takes place for other beams than the laser beams 17 emitted by the laser diodes on both edges. The extent of the laser radiation emitted by the radiation source 13 is therefore limited in relation to the x direction. The geometry of the arrangement could also be selected in such a way that beam parts of the laser beams 17 of the laser diodes 16 are already reflected on the bounding surfaces 33, 34 before striking the cylindrical surface 23.

In relation to the x axis, the guiding of the laser radiation thus takes place by internal reflection on the bounding surfaces 33, 34. If the extent of the laser medium 1 in the x axis is sufficiently large, the reflection on the bounding surfaces 33, 34 could also be obviated (the optical component 22 is then likewise formed correspondingly long in the x direction).

Overall, low-loss and substantially homogeneous illumination of the laser medium 1 is achieved. Since there is a strong overlap of the laser beams 17 emitted by the individual laser diodes 16, the illumination still remains relatively homogeneous even if some of the laser diodes 16 fail.

The radius of curvature of the cylindrical surface 23 lies, for example, in the range of from 30 mm to 100 mm, and in the exemplary embodiment it is 57.8 mm. Along the z axis, the distance from the radiation source 13 lies, for example, in the range of between 13 mm and 45 mm, and in the exemplary embodiment it is 25 mm. The tilt angle of the cylindrical surface relative to the orientation in which the cylindrical surface cuts the z axis lies, for example, in the range of 10° to 25°, and in the exemplary embodiment it is 15°.

The distance between the radiation source 13 and the cylindrical surface 23 should be such that, after their reflection on the cylindrical surface, the individual laser beams are at least substantially collimated to the extent that the marginal rays 32 make angles of at least less than 10° with one another.

FIGS. 11 to 14 are representations similar to FIGS. 7 to 10 for a second exemplary embodiment of the invention. Here, a cylindrical mirror is provided as the optical component 22' comprising the cylindrical surface 23. The cylindrical surface 23 may, for example, be formed by a circumferential part of the lateral surface of a right circular cylinder, which is curved around the cylinder axis 29, which is perpendicular to the y-z plane, i.e. it extends parallel to the x axis.

The beam profile is similar to the exemplary embodiment described above. Here, however, the effect that the divergence angles are reduced, when entering a material having a refractive index which is greater than that of air, is absent. In order to obtain an appropriate width of the laser radiation in the projection onto the y-z plane at the position of the amplifying laser medium, the cylindrical surface 23 must thus be curved more strongly than in the first exemplary embodiment. Overall, a less pronounced overall minimum waist of the laser radiation is obtained in the region in which the amplifying laser medium 1 is arranged. The aberrations, in particular spherical aberrations, in relation to the overlap of the individual beams are therefore greater than in the first exemplary embodiment.

The radius of curvature of the cylindrical axis 23 may, for example, lie in the range of from 15 mm to 30 mm. The distance from the radiation source 13, measured along the z axis, preferably lies in the range of about half the radius of curvature (+/−10%).

Reflection on bounding surfaces, which limit the laser radiation in relation to the x direction by reflection, is not represented in this exemplary embodiment. Such limitation, however, could exist due to the provision of mirrors that comprise such reflective bounding surfaces 33, 34. The bounding surfaces would in this case, in particular, again be planar and arranged perpendicular to the x axis.

Figure 15:
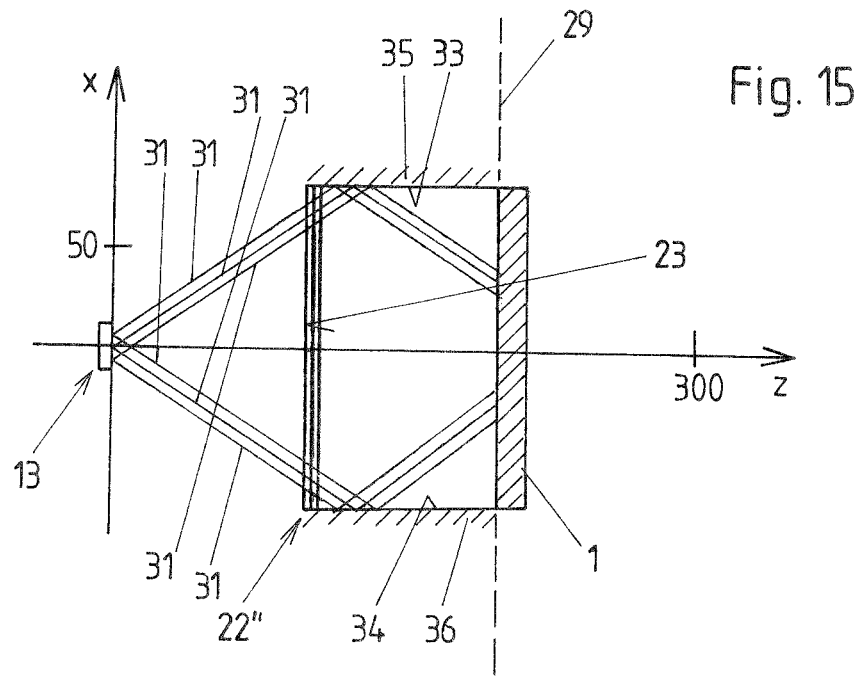
FIGS. 15 and 16 show representations similar to FIGS. 9 and 10 for a third embodiment of the invention.
Figure 16:
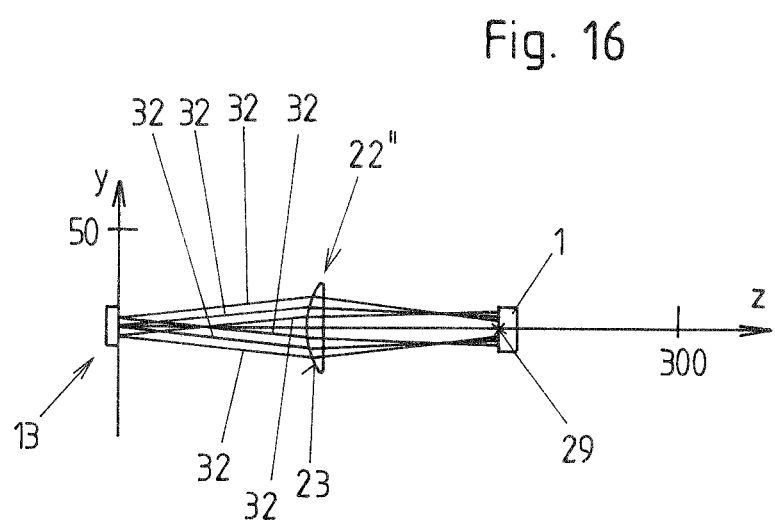

FIGS. 15 and 16 show representations similar to FIGS. 9 and 10, or 13 and 14, for a third exemplary embodiment of the invention.

In this exemplary embodiment, the optical component 22", which comprises the cylindrical surface 23, is a cylindrical lens. The cylindrical surface may, for example, be formed by a circumferential part of the lateral surface of a right circular cylinder, which is curved around the cylinder axis 29, which is perpendicular to the y-z plane.

The amplifying laser medium 1 is in this case arranged in such a way that the side surface 6, through which the laser radiation emitted by the radiation source 13 enters, lies at the position of the cylinder axis 37 in relation to the z axis. The laser medium 1 could also be arranged in such a way that the cylinder axis 37 lies inside the laser medium 1, or in the region of the rear side surface 30. The rear side surface 30 could in turn be mirrored.

The focal length of the cylindrical lens may, for example, lie in the range of from 50 mm to 200 mm, the distance between the cylindrical lens and the radiation source 13 lying in the range of the focal length (+/−10%). The distance between the cylindrical lens and the laser medium 1 likewise lies in the range of the focal length (+/−10%).

After passing through the optical component 22", the two marginal rays 32 of the laser beam 17 of a respective laser diode 16 preferably travel together, or parallel to one another. At least, the divergence of the two marginal rays 32 is reduced by the optical component 22". The optical component 22" thus has a converging effect in relation to the original divergence in the y-z plane.

In relation to the x-z plane, the divergence of the two marginal rays 31 of the laser beam 17 of a respective laser diode 16 is not reduced. In the exemplary embodiment, however, plane mirrors 35, 36 are provided, the mirror surfaces of which form bounding surfaces 33, 34 for the laser radiation, the bounding surfaces 33, 34 being perpendicular to the x axis. The extent of the laser radiation of the laser radiation emitted by the radiation source 13 is therefore again limited in the x direction.

If the extent of the laser medium 1 in the x direction is sufficiently large, the bounding surfaces 33, 34 could again be omitted.

The individual laser beams 17 of the laser diodes 16 overlap to a significant extent in the region of the laser medium 1. In view of the relatively long focal length, however, the region illuminated by the laser radiation is relatively large and the amplifying laser medium 1 must be made correspondingly large.

Advantageously, the focal length of the cylindrical lens is more than five times the distance, in relation to the direction of the y axis, between the two laser diodes of the radiation source which are at the greatest distance from one another in the y direction.

The use of cylindrical lenses with shorter focal lengths is possible, although this entails reductions in the collimation and the homogeneity of the illumination.

The cylindrical surface of the component 22" could also be arranged on the side facing the laser medium 1. A cylindrical lens with cylindrical surfaces on both sides could also be used.

By virtue of a pump device according to the invention, compact side pumped solid-state lasers can in particular be provided. For example, a laser with a pulse energy of at least 100 mJ and pulses which are shorter than 20 ns may be produced. The footprint (=laser head without electronics) may in this case have dimensions of less than 15 cm×10 cm, preferably dimensions in the range of 10 cm×5 cm, and a mass of less than 2 kg so that it is suitable for handheld applications.

On the other hand, a pulsed laser with a pulse energy of more than 3 mJ and a pulse length of less than 10 ns may be provided, which has dimensions of less than 10 cm×5 cm or even less (again, laser head without electronics). By virtue of the invention, a compact pulse laser may be provided which has a high efficiency of more than 10%, or even more than 15%, in relation to the energy of the pulse generated as a proportion of the energy of the (optical) pump pulse. Due to the efficiency, it is possible to optionally provide a compact pulse laser which does not require water cooling. It is possible to optionally provide a 100 Hz/100 mJ laser which is suitable in practice for battery operation. In particular, the use of a cylindrical lens having the cylindrical surface, with a long focal length, as shown for example in the third exemplary embodiment of the invention, for the pumping of a laser with a high energy, in particular 1 J or more, is advantageous.

A pump device according to the invention could also be used to pump lasers other than the solid-state lasers mentioned, for example also for pumping fiber lasers or disk lasers.

A device according to the invention also has the advantage that the position and angle tolerances of the radiation source, particularly in the form of a laser diode stack, are relatively non-critical in comparison with the prior art. By virtue of this, for example, the radiation source may be provided as a module replaceable by the user, particularly in the form of a laser diode stack.

| Legend for the References: | |
|---|---|
| 1 | amplifying laser medium |
| 2 | entry surface |
| 3 | exit surface |
| 4 | laser beam |
| 5 | laser radiation |
| 6 | side surface |
| 7 | end mirror |
| 8 | output mirror |
| 9 | return prism |
| 10 | polarizer |
| 11 | Pockels cell |
| 12 | lambda/4 plate |
| 13 | radiation source |
| 14 | optics |
| 15 | bars |
| 16 | laser diode |
| 17 | laser beam |
| 18 | emission angle |
| 19 | emission angle |
| 20 | carrier |
| 21 | heat sink |
| 22, 22', 22" | optical component |
| 23 | cylindrical surface |
| 24 | entry surface |
| 25 | exit surface |
| 26 | carrier |
| 27 | heat sink |
| 28 | axial ray |
| 29 | cylinder axis |
| 30 | side surface |
| 31 | marginal ray |
| 32 | marginal ray |
| 33 | bounding surface |
| 34 | bounding surface |
| 35 | mirror |
| 36 | mirror |

The invention claimed is:

1. A side-pumped solid state slab laser comprising:
an amplifying laser medium which is a solid body in the shape of a slab and which has end surfaces, through which a beam of laser radiation emitted by the amplifying laser medium passes; and
a pump device for pumping the amplifying laser medium through a side surface of the amplifying laser medium which is at an angle to the end surfaces of the amplifying laser medium, the pump device comprising:
a radiation source with a a two-dimensional array of laser diodes which emit laser beams that have parallel beam axes extending in a direction of a z axis and diverging at least two times as strongly in a direction of an x axis perpendicular to the z axis than in a direction of a y axis perpendicular to the z axis and perpendicular to the x axis, the laser diodes of the two-dimensional array lying in a plane perpendicular to the z axis, and
at least one optical component having a cylindrical surface, with which at least some of the laser beams emitted by the laser diodes interact, and which is parallel to the x axis and is curved in a plane perpendicular to the x axis,
wherein at least part of the laser beams emitted by the laser diodes pass through an entry surface into the optical component and through the optical component to a reflective cylindrical surface of the optical component, where they are internally reflected in the optical component, and from the cylindrical surface through the optical component to an exit surface of the optical component, and through this exit surface to the amplifying laser medium, the entry surface, the cylindrical surface and the exit surface being formed by different surfaces of the optical component, and the optical component has reflective bounding surfaces which limit an extent of the laser radiation emitted by the radiation source in the direction of the x axis on both sides.

2. The pump device as claimed in claim 1, wherein the radiation source comprises two or more of the laser diodes arranged at different positions in relation to the x axis, the laser beams of which interact with the cylindrical surface.

3. The pump device as claimed in claim 1, wherein the radiation source comprises two or more of the laser diodes arranged at different positions in relation to the y axis, the laser beams of which interact with the cylindrical surface.

4. The pump device as claimed in claim 1, wherein the laser beams of all of the laser diodes interact with the cylindrical surface of the optical component.

5. The pump device as claimed in claim 1, wherein the cylindrical surface of the component has a converging effect on the laser beams interacting with the cylindrical surface.

6. The pump device as claimed in claim 1, wherein the radiation source is a laser diode stack which comprises a plurality of bars, each with a plurality of the laser diodes.

7. The pump device as claimed in claim 6, wherein the laser diodes of a bar are spaced apart in the direction of the y axis.

8. The pump device as claimed in claim 7, wherein all bars or at least some of the bars are arranged next to one another in the direction of the x axis.

* * * * *